(12) United States Patent
Clevenger et al.

(10) Patent No.: US 12,142,525 B2
(45) Date of Patent: Nov. 12, 2024

(54) SELF-ALIGNING SPACER TIGHT PITCH VIA

(71) Applicant: International Business Machines Corporation, Armonk, NY (US)

(72) Inventors: Lawrence A. Clevenger, Saratoga Springs, NY (US); Brent Anderson, Jericho, VT (US); Nicholas Anthony Lanzillo, Wynantskill, NY (US)

(73) Assignee: International Business Machines Corporation, Armonk, NY (US)

( * ) Notice: Subject to any disclaimer, the term of this patent is extended or adjusted under 35 U.S.C. 154(b) by 368 days.

(21) Appl. No.: 17/378,819

(22) Filed: Jul. 19, 2021

(65) Prior Publication Data

US 2023/0016977 A1    Jan. 19, 2023

(51) Int. Cl.
  *H01L 21/768*    (2006.01)
  *H01L 23/522*    (2006.01)
  *H01L 23/528*    (2006.01)

(52) U.S. Cl.
  CPC .. *H01L 21/76897* (2013.01); *H01L 21/76807* (2013.01); *H01L 21/76816* (2013.01); *H01L 21/76837* (2013.01); *H01L 21/76877* (2013.01); *H01L 23/5226* (2013.01); *H01L 23/5283* (2013.01)

(58) Field of Classification Search
  CPC ........ H01L 21/76897; H01L 21/76807; H01L 21/76816; H01L 21/76837; H01L 21/76877; H01L 21/76883; H01L 21/76834; H01L 23/5226
  See application file for complete search history.

(56) References Cited

U.S. PATENT DOCUMENTS

| | | | |
|---|---|---|---|
| 5,693,568 A | 12/1997 | Liu | |
| 5,851,913 A * | 12/1998 | Brennan | H01L 21/76807 438/622 |
| 6,187,666 B1 | 2/2001 | Singh | |
| 6,245,669 B1 | 6/2001 | Fu | |
| 6,291,334 B1 | 9/2001 | Somekh | |
| 6,441,418 B1 | 8/2002 | Shields | |
| 7,030,010 B2 | 4/2006 | Farnworth | |
| 7,351,648 B2 | 4/2008 | Furukawa | |
| 7,601,607 B2 | 10/2009 | Liu | |
| 9,613,861 B2 | 4/2017 | Anderson | |
| 2001/0055840 A1* | 12/2001 | Verret | H01L 21/76882 438/142 |
| 2002/0125209 A1* | 9/2002 | Tseng | H01L 21/76831 216/18 |
| 2014/0312508 A1* | 10/2014 | Boyanov | H01L 21/76883 257/774 |

(Continued)

*Primary Examiner* — Britt D Hanley
*Assistant Examiner* — Vicki B. Booker
(74) *Attorney, Agent, or Firm* — Gavin Giraud

(57) ABSTRACT

Embodiments disclosed herein describe semiconductor devices that include semiconductor structures and methods of forming the semiconductor structures. The semiconductor structures may include an upper conductive line, a first lower conductive line laterally insulated by a first lower dielectric region and a second lower dielectric region. The semiconductor structure also includes a lower level via region above the first lower conductive line. The lower level via region includes a dielectric blocking material and a spacer material.

13 Claims, 7 Drawing Sheets

(56) References Cited

U.S. PATENT DOCUMENTS

| | | | |
|---|---|---|---|
| 2015/0279780 A1* | 10/2015 | Zhang | H01L 23/5226 |
| | | | 257/774 |
| 2016/0148869 A1* | 5/2016 | Schenker | H01L 21/02167 |
| | | | 438/618 |
| 2017/0330761 A1* | 11/2017 | Chawla | H01L 23/53295 |
| 2019/0164815 A1 | 5/2019 | Lin | |
| 2020/0098620 A1* | 3/2020 | Lee | H01L 21/76897 |
| 2021/0005551 A1* | 1/2021 | Lee | H01L 21/76897 |

\* cited by examiner

SELF-ALIGNING SPACER TIGHT PITCH VIA

BACKGROUND

The present invention relates generally to the field of fabrication methods and resulting structures for semiconductor devices, and more particularly to etching a spacer material to correct for misaligned vias.

In fabricating semiconductor devices, millions of devices can be located together on a single substrate. Useful control of these millions of devices relies on the application of electrical signals to specific devices while insulting the electrical signals from shorting to anything else (e.g., other devices). The electrical signals propagate from the substrate and the package contacts to the devices through metallized layers, which can act as wiring (e.g., channels). Typical integrated circuit packages may include seven or more metallized layers. Each metallized layer is insulated from the layer below except for specific connections called vias. Vias are typically formed as openings between layers that are filled with a conductive material during fabrication. Smaller pitch of devices and of vias (i.e., smaller distance between common features of a device or a via) can lead to increases in speed and efficiency of semiconductor devices. The overlay and critical dimension tolerance between line and via of small-pitch devices, however, drives the use of self-aligned features and processes.

SUMMARY

According to one embodiment of the present invention, a semiconductor device includes a semiconductor structure. The semiconductor structure includes an upper conductive line, a first lower conductive line laterally insulated by a first lower dielectric region and a second lower dielectric region. The semiconductor structure also includes a lower level via region above the first lower conductive line. The lower level via region includes a dielectric blocking material and a spacer material.

According to one embodiment of the present invention, a method of forming a semiconductor structure includes etching a via opening in an upper level dielectric, etching in the via opening to remove lower level dielectric blocking material from: (i) a portion of a first dielectric blocking material over a first conductive line to form a spacer region, and (ii) a second lower level via region over a second conductive line to form a self-aligned via cavity. The method may also include depositing a spacer material in the via opening, the self-aligned via cavity, and the spacer region. The method may also include etching the spacer material from the via opening and the self-aligned via cavity.

According to one embodiment of the present invention, a semiconductor structure may include a first lower level via region over a first lower level conductive line having a spacer region comprising a spacer material; and a first dielectric blocking material. The semiconductor structure may also include a second lower level via region over a second lower level conductive line comprising a conductive via electrically coupling a second conductive line to an upper conductive line and a third lower level via region over a third lower level conductive line comprising a third dielectric blocking material.

DETAILED DESCRIPTION

Figure 1:
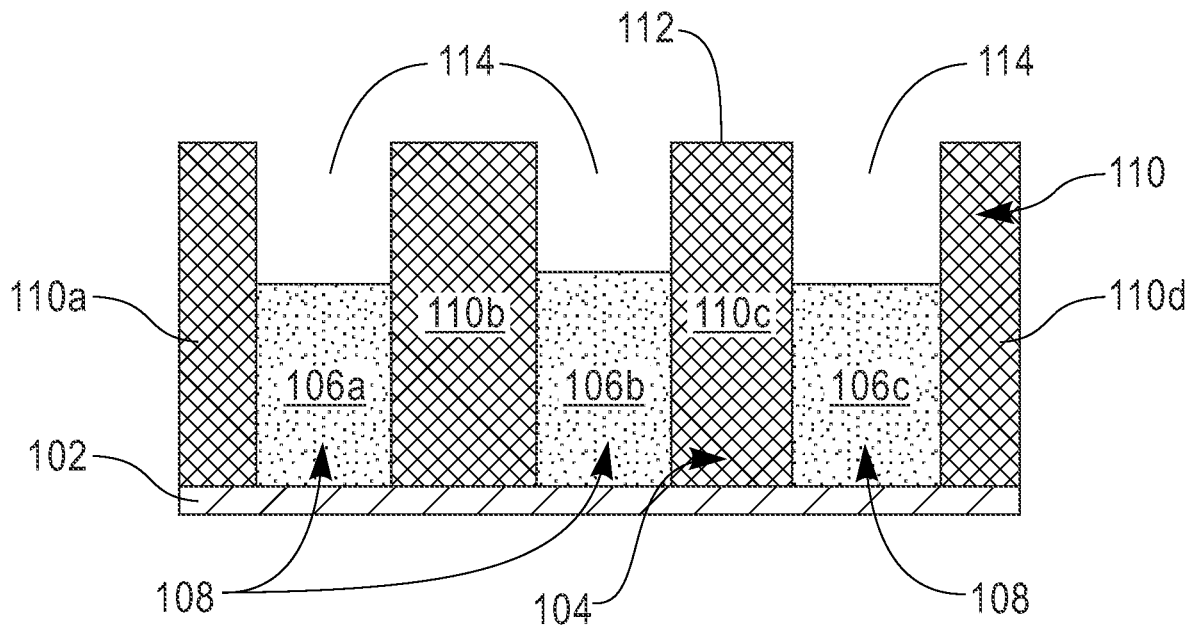
FIG. 1 is a schematic cross-sectional side view depicting a semiconductor structure at a fabrication stage of a damascene fabrication process, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface. Typically, the major surface is along a plane of a monocrystalline silicon layer on which transistor devices are fabricated.

For integrated circuits, the formation of more vias in a smaller area can increase the speed and efficiency of the device overall. Circuits with smaller pitch, however, can suffer additional risk of shorting and electrical failure from misalignment during via formation. The embodiments disclosed herein therefore provide a deposition and lateral etching of a spacer material after etching vias. The spacer material fills up any regions that are incorrectly etched as a result of via misalignment. The spacer material enables patterning and metallization at tight pitch with just a single hard mask.

Referring now to the figures, FIG. 1 is a schematic cross-sectional side view depicting a semiconductor structure 100 (e.g., a back end of line (BEOL) wiring structure) at a fabrication stage of the processing method, in accordance with one embodiment of the present invention. FIG. 1 shows an etch stop layer 102 and a lower dielectric layer 104 split by conductive lines 106 (i.e., a first conductive line 106a, a second conductive line 106b, and a third conductive line 106c). The etch stop layer 102, in certain embodiments, separates the semiconductor structure 100 from a semiconductor device layer or another wiring structure lower than the semiconductor structure 100. The conductive lines 106 may be formed by etching the dielectric layer 104 in accordance with a pattern (e.g., lithography mask applied to photoresist) to form spaces 108 and dielectric regions 110 (i.e., first dielectric region 110a, second dielectric region 110b, third dielectric region 110c, and fourth dielectric region 110d). The spaces 108 are then filled with a conductive filler material (e.g., metal). Many additional conductive lines 106 and dielectric regions 110 may be formed in the lower dielectric layer 104. After the conductive lines 106 are formed, another etch process may recess the conductive lines 106 from a top 112 of the dielectric layer 104 leaving lower level via regions 114 above each conductive line 106.

Figure 2:
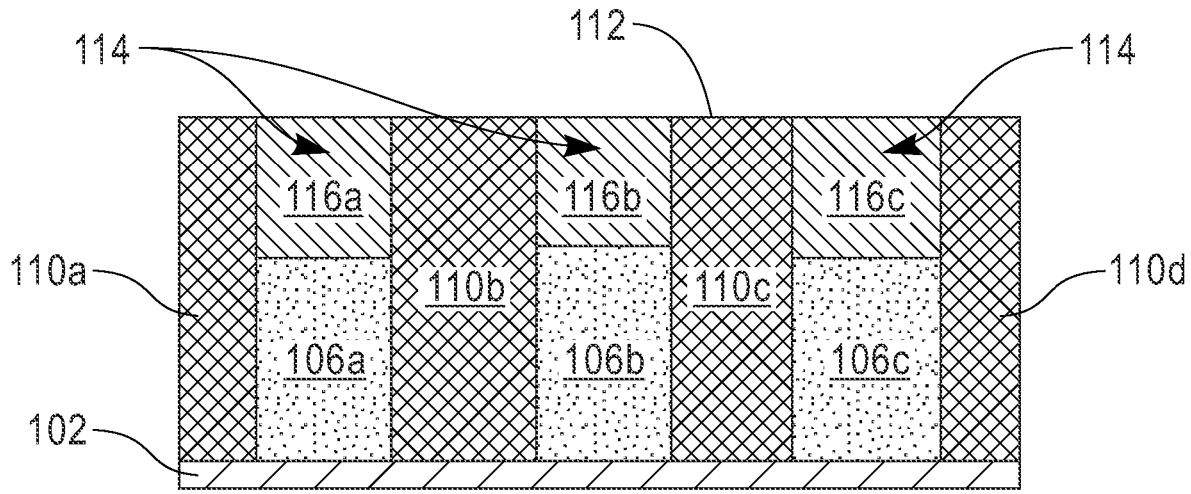
FIG. 2 is a schematic cross-sectional side view depicting the semiconductor structure of FIG. 1 at a fabrication stage, in accordance with one embodiment of the present invention.

FIG. 2 is a schematic cross-sectional side view depicting the semiconductor structure 100 of FIG. 1 at a fabrication stage of the processing method, in accordance with one embodiment of the present invention. FIG. 2 shows dielectric blocking materials 116 formed within the lower level via regions 114. The dielectric blocking materials 116 are formed over the conductive lines 106 (i.e., a first dielectric blocking material 116a over the first conductive line 106a, a second dielectric blocking material 116b over the second conductive line 106b, and a third dielectric blocking material 116c over the third conductive line 106c). The dielectric blocking materials 116 may be planarized after formation. In certain embodiments the dielectric blocking material 116 is formed flush with the top 112 without being planarized.

Figure 3:
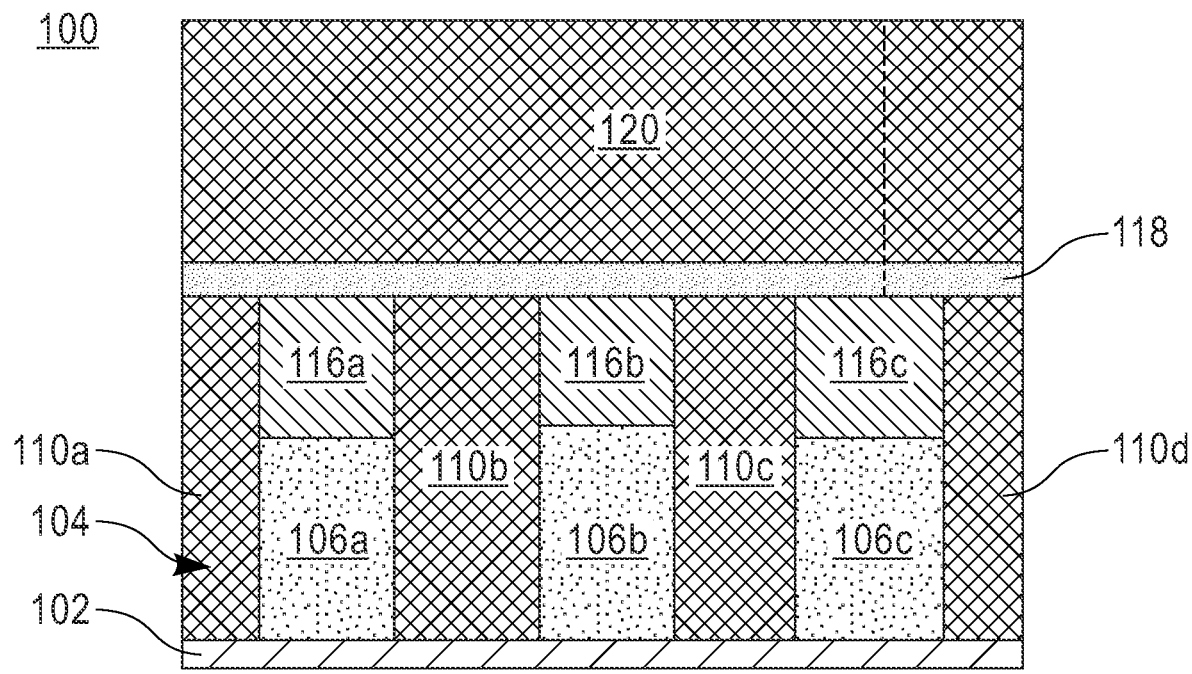
FIG. 3 is a schematic cross-sectional side view depicting the semiconductor structure of FIG. 1 at a fabrication stage, in accordance with one embodiment of the present invention.

FIG. 3 is a schematic cross-sectional side view depicting the semiconductor structure 100 of FIG. 1 at a fabrication stage of the processing method, in accordance with one embodiment of the present invention. FIG. 3 shows an additional etch stop layer 118 formed on the top 112 of the dielectric layer 104 (i.e., the dielectric regions 110 and the dielectric blocking materials 116). The semiconductor structure 100 also includes an upper dielectric layer 120. The upper dielectric layer 120 may include chemically similar or identical materials to the lower dielectric layer 104. For example, the upper dielectric layer 120 and the lower dielectric layer 104 may include any suitable dielectric such as, but not limited to: silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycarbonitride (SiOCN), silicon oxide, and combinations thereof. The upper dielectric layer 120 and the lower dielectric layer 104 can be formed by any suitable techniques such as deposition followed by directional etch. Deposition may include, but is not limited to, atomic layer deposition (ALD) and chemical vapor deposition (CVD). Directional etch may include, but is not limited to, reactive ion etch (RIE). After the upper dielectric layer 120 is formed, a line region 122 may be etched to make room for a mask shown in the subsequent figure.

Figure 4:
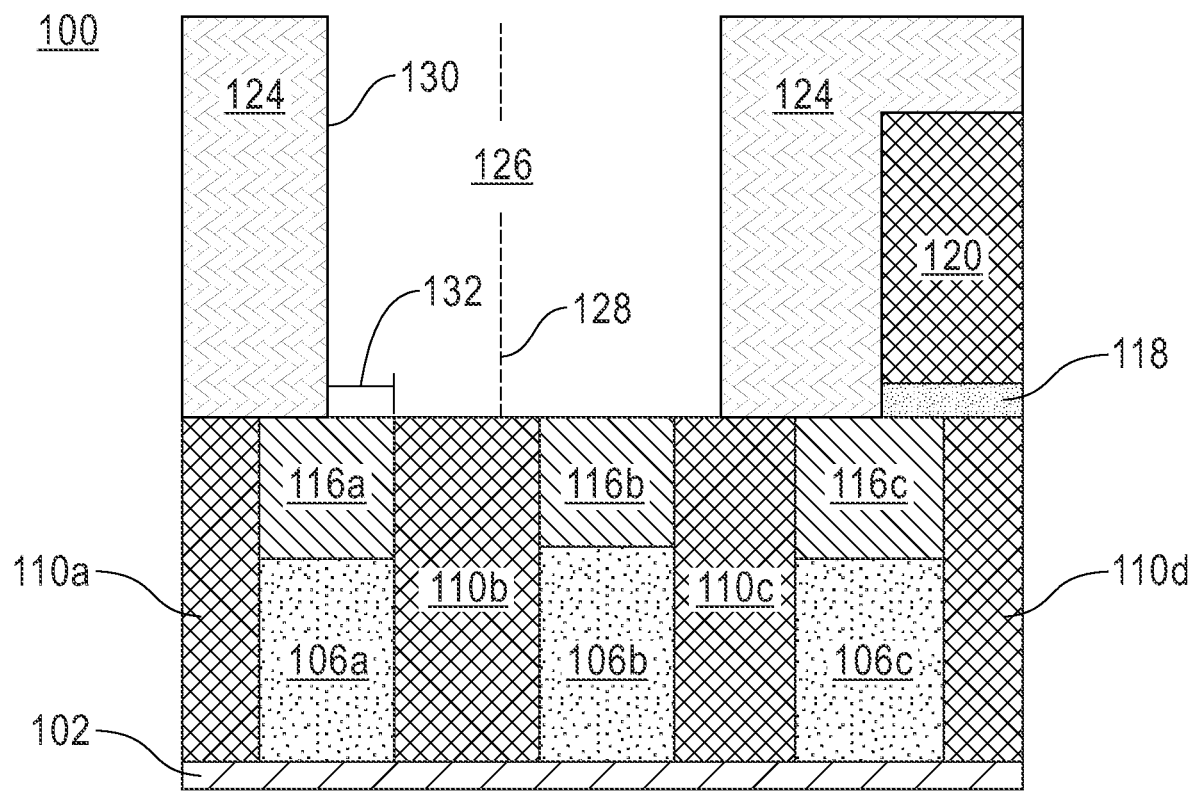
FIG. 4 is a schematic cross-sectional side view depicting the semiconductor structure of FIG. 1 at a fabrication stage, in accordance with one embodiment of the present invention.

FIG. 4 is a schematic cross-sectional side view depicting the semiconductor structure 100 of FIG. 1 at a fabrication stage of the processing method, in accordance with one embodiment of the present invention. FIG. 4 shows the upper dielectric layer 120 with a line region 122 etched away above the top 112 of the lower dielectric layer 104. The line region 122 is etched as the eventual location for an upper conductive line. After the line region 122 is etched away, a mask 124 is applied and etched with a via opening 126. The via opening 126 is included in the design for the semiconductor structure 100 as one step for forming a conductive via to the second conductive line 106b. In a perfectly aligned via opening 126, the mask 124 would cover everything outside of a designed side location 128. That is, the via opening 126 is meant to form only over the second dielectric blocking material 116b, masking the first dielectric blocking material 116a and the third dielectric blocking material 116c. In the formation of some via openings, however (especially vias with tight pitch dimensions), the etching of the mask 124 may suffer from misalignment. In the illustrated embodiment, for instance, the via opening 126 is misaligned from the designed side location 128 to a misaligned side location 130 (the illustrated embodiment is not necessarily drawn to scale, and the misalignment is exaggerated for purposes of illustration). The misaligned side location 130 overlaps the first dielectric blocking material 116a first conductive line 106a by an overlap distance 132.

Figure 5:
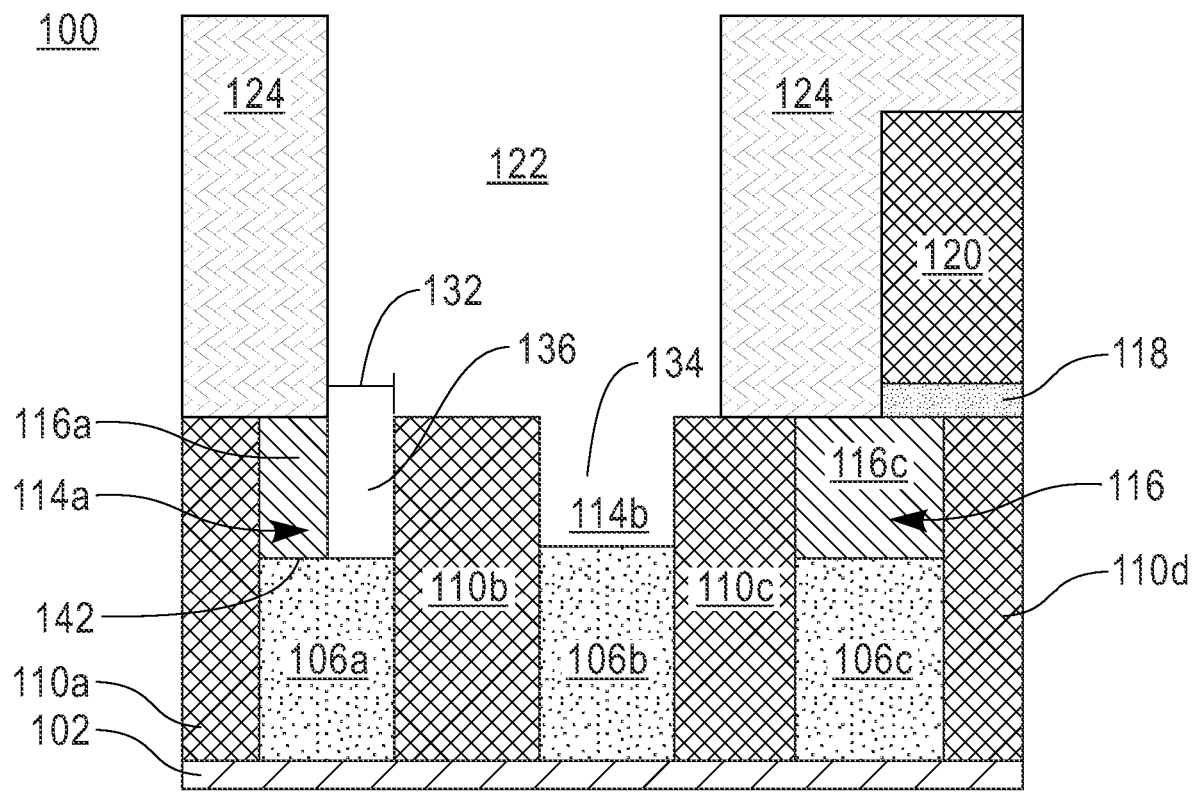
FIG. 5 is a schematic cross-sectional side view depicting the semiconductor structure of FIG. 1 at a fabrication stage, in accordance with one embodiment of the present invention.

FIG. 5 is a schematic cross-sectional side view depicting the semiconductor structure 100 of FIG. 1 at a fabrication stage of the processing method, in accordance with one embodiment of the present invention. FIG. 5 shows the result of a selective etch step in which any exposed dielectric blocking material 116 is selectively etched from within the via opening 126. The selective etch may include chemical or energetic etch that targets the dielectric blocking material 116 without etching or effecting the upper dielectric layer 120, the lower dielectric layer 104, or any other component aside from the dielectric blocking materials 116. The second dielectric blocking material 116b, for example, is completely etched from above the second conductive line 106b, leaving a self-aligned via cavity 134 within the second lower level via region 114b. Additionally (and unintentionally), the misalignment overlap distance 132 of the via opening 126 causes the portion of the first dielectric blocking material 116a under the overlap distance 132 to also be etched from above the first conductive line 106a, leaving a spacer region 136. If unmitigated, the spacer region 136 can potentially cause an electrical connection with the first conductive line 106a that can decrease the effectiveness of the semiconductor structure 100.

Figure 6:
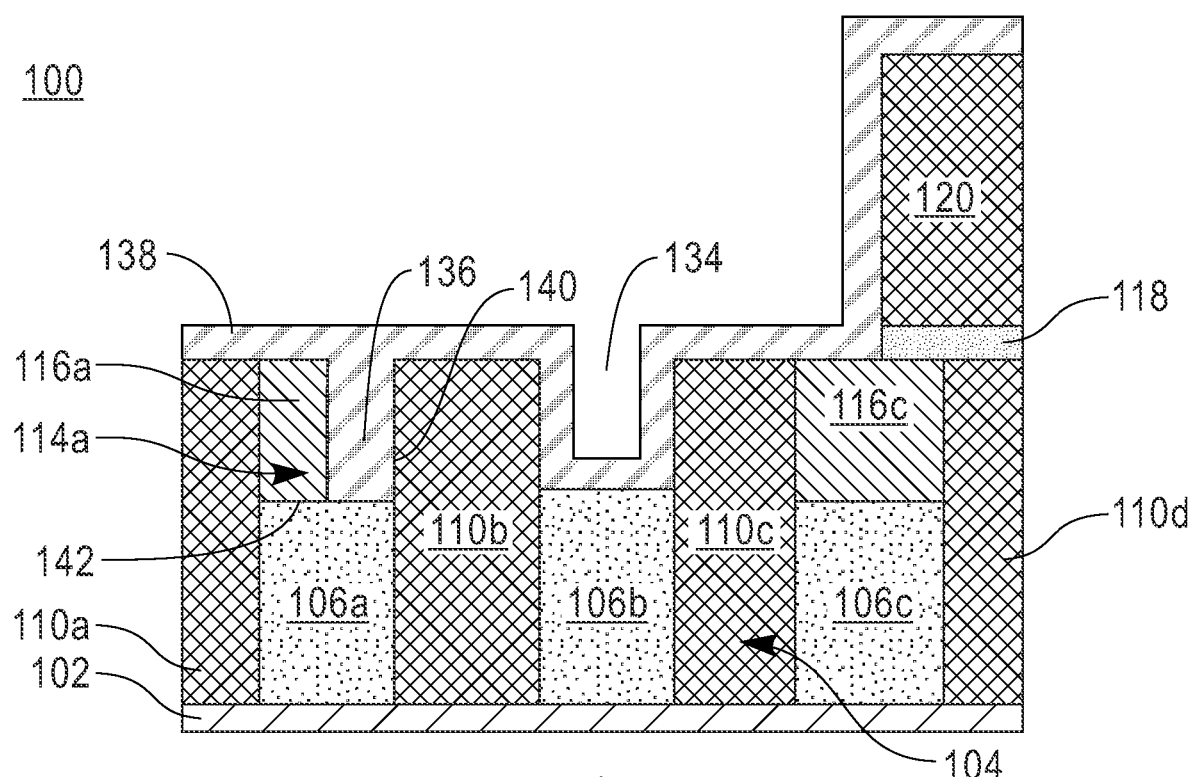
FIG. 6 is a schematic cross-sectional side view depicting the semiconductor structure of FIG. 1 at a fabrication stage, in accordance with one embodiment of the present invention.

FIG. 6 is a schematic cross-sectional side view depicting the semiconductor structure 100 of FIG. 1 at a fabrication stage of the processing method, in accordance with one embodiment of the present invention. FIG. 6 shows a spacer material 138 formed over the semiconductor structure 100 after the mask 124 has been removed. The spacer material 138 may include dielectric materials listed above such that the film of the spacer material 138 is conformal, but also typically includes a material that is different from the upper dielectric layer 120. The spacer material 138 forms over the upper dielectric layer 120 (outside of the line region 122 where it has not been etched), the lower dielectric layer 104, and within the self-aligned via cavity 134 and the spacer region 136. The spacer region 136 is narrow enough that the spacer material 138 pinches off, meaning that the spacer material 138 from a first side 140 of the spacer region 136 touches the spacer material 138 from a second side 142 so that the spacer region 136 is completely filled. The spacer material 138 also forms in the self-aligned via cavity 134, but does not pinch off.

Figure 7:
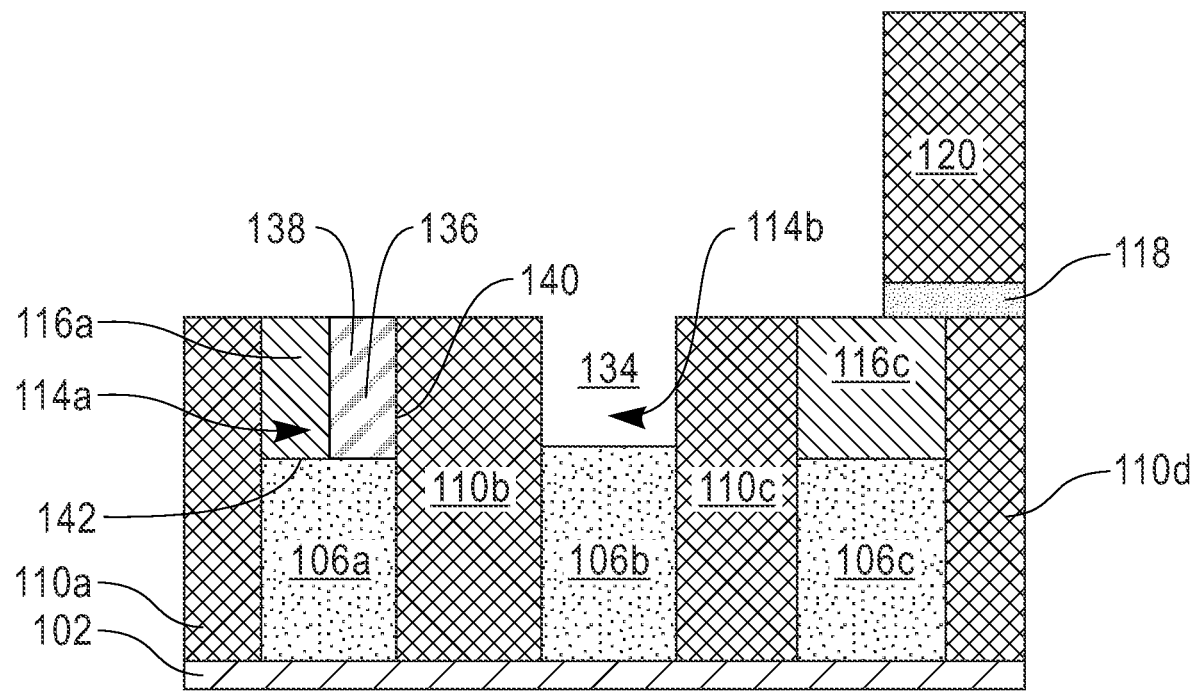
FIG. 7 is a schematic cross-sectional side view depicting the semiconductor structure of FIG. 1 at a fabrication stage, in accordance with one embodiment of the present invention.

FIG. 7 is a schematic cross-sectional side view depicting the semiconductor structure 100 of FIG. 1 at a fabrication stage of the processing method, in accordance with one embodiment of the present invention. FIG. 7 shows the spacer material 138 etched from the upper dielectric layer 120, the lower dielectric layer 104, and within the self-aligned via cavity 134. The spacer material 138 may be etched using a lateral etching process or a conformal wet chemistry step to provide a uniform etch rate to the exposed film of the spacer material 138. The spacer material 138 is not etched, however, from within the spacer region 136 due to the pinch off between the first side 140 and the second side 142. Therefore, the first lower level via region 114a is fully blocked, the third lower level via region 114c is fully blocked (i.e., having an intact dielectric blocking material 116c located vertically between the third lower conductive line 106c and the upper dielectric layer 120) while the second lower level via region 114b is open.

Figure 8:
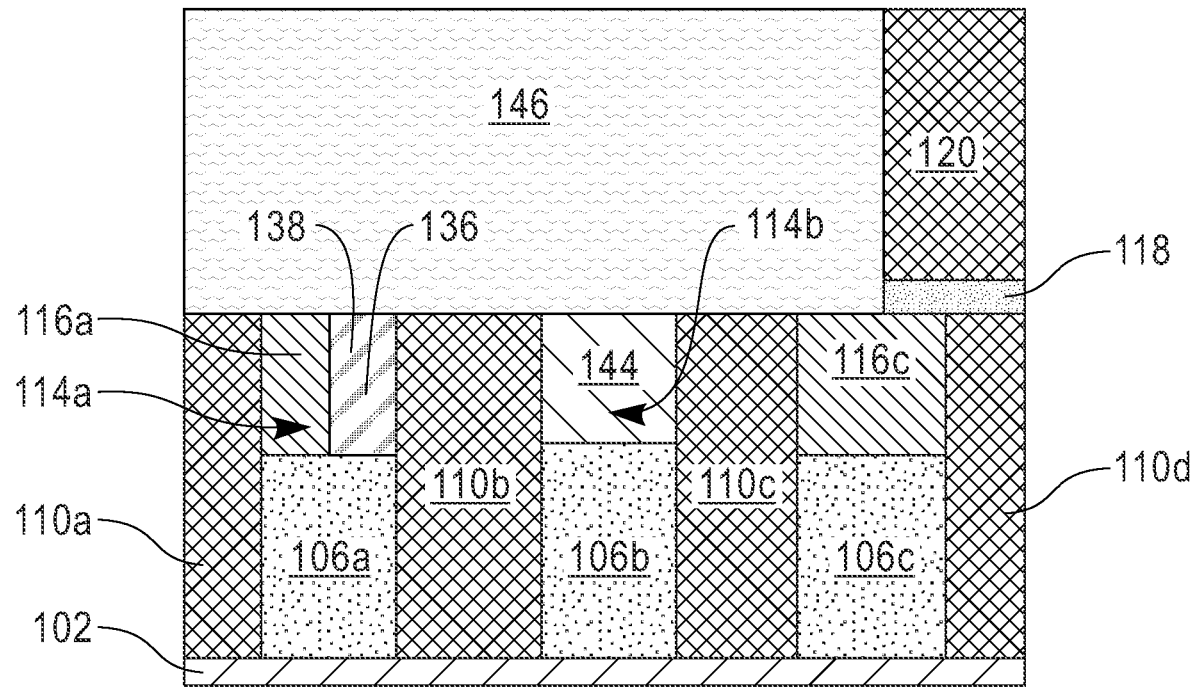
FIG. 8 is a schematic cross-sectional side view depicting the semiconductor structure of FIG. 1 at a fabrication stage, in accordance with one embodiment of the present invention.

FIG. 8 is a schematic cross-sectional side view depicting the semiconductor structure 100 of FIG. 1 at a fabrication stage of the processing method, in accordance with one embodiment of the present invention. FIG. 8 shows a conductive via 144 formed in the second lower level via region 114b. The conductive via 144 is electrically coupled to the second lower conductive line 106b and to an upper conductive line 146 formed in the line region 122. The conductive via 144 may be formed of a same or similar material as the lower conductive lines 106 and the upper conductive line 146. Additionally or alternatively, the process may include filling the via opening 126 with conductive material that is different from a metal of the second conductive line 106b and from a metal of the upper conductive line 146.

The first lower level via region 114a includes a first dielectric blocking material 116a and a spacer material 138. The spacer material 138 prevents any electrical signal or energy from propagating between the first lower conductive line 106a and the upper conductive line 146 through the spacer region 136. Without the spacer material 138, the process of forming the conductive via 144 could form conductive material within the spacer region 136, but the spacer material 138 has blocked that possibility. The third lower level via region 114c is fully blocked as well, since the third dielectric blocking material 116c was completely masked during etch of the dielectric blocking material 116.

Figure 9:
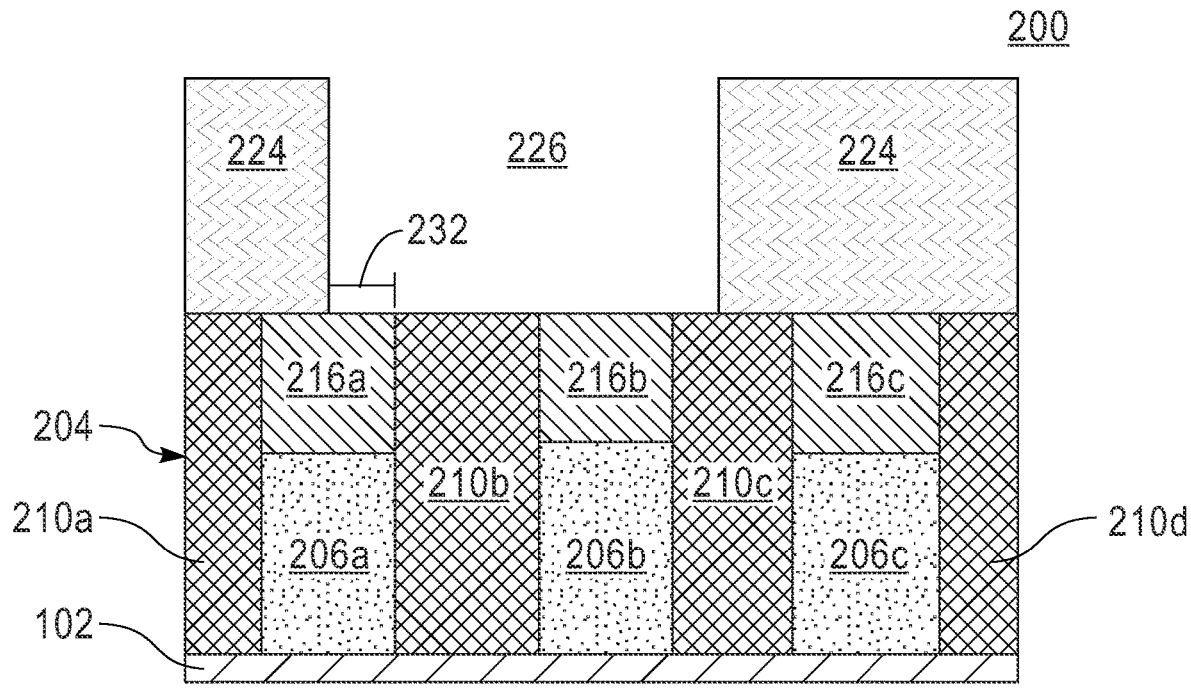
FIG. 9 is a schematic cross-sectional side view depicting a semiconductor structure at a fabrication stage of a subtractive fabrication process, in accordance with one embodiment of the present invention.

FIG. 9 is a schematic cross-sectional side view depicting a semiconductor structure 200 at a fabrication stage of the processing method, in accordance with one embodiment of the present invention. FIGS. 9-13 show a subtractive fabrication process for forming a spacer region and a conductive via. The formation of a lower dielectric layer 204 (i.e., with an etch stop layer 202, conductive lines 206, dielectric regions 210, and dielectric blocking material 216) may follow similar process steps illustrated in FIGS. 1 and 2 of the first embodiment of the semiconductor structure 100. Rather than next forming an upper dielectric layer (e.g., the upper dielectric layer 120 of the first semiconductor structure 100), the second semiconductor structure 200 next forms a mask 224, as illustrated in FIG. 9. The mask 224 is shown with a via opening 226 having a similar misalignment to the first semiconductor structure 100. Namely, the via opening 226 is designed to only expose a second dielectric blocking material 216b, but has an overlap 232 under which a first dielectric blocking material 216a is unintentionally exposed. A third dielectric blocking material 216c is fully masked by the mask 224, as intended.

Figure 10:
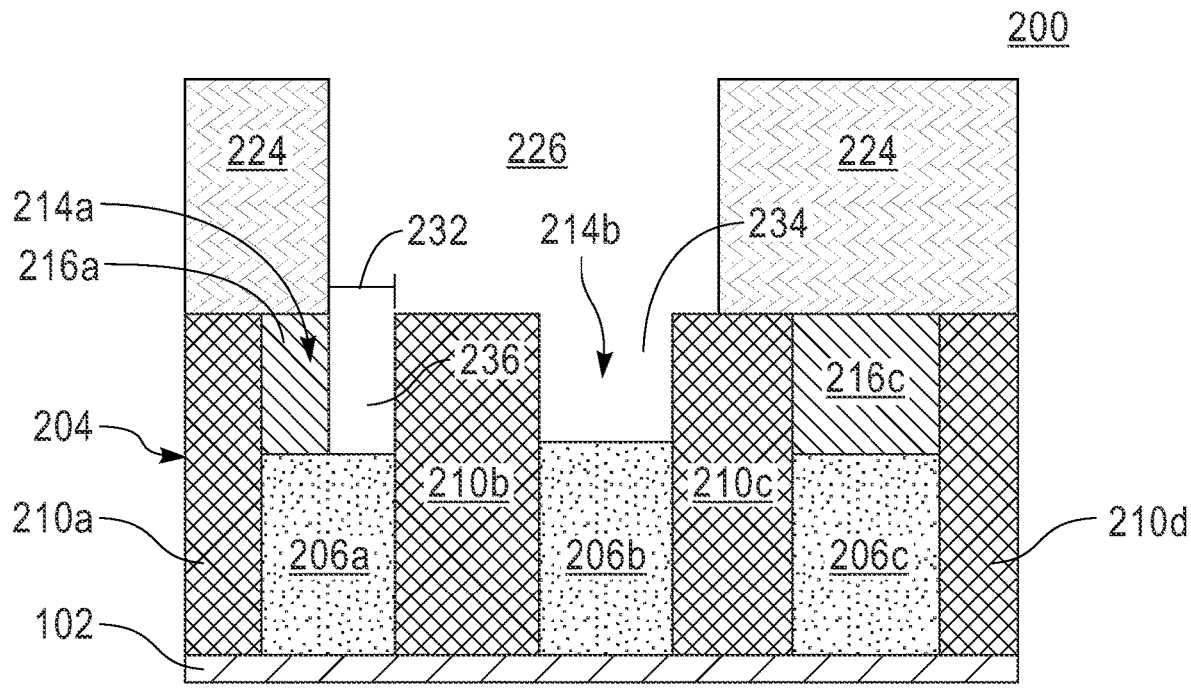
FIG. 10 is a schematic cross-sectional side view of the semiconductor structure of FIG. 9 at a fabrication state, in accordance with one embodiment of the present invention.

FIG. 10 is a schematic cross-sectional side view depicting the semiconductor structure 200 at a fabrication stage of the processing method, in accordance with one embodiment of the present invention. FIG. 10 shows the result of a selective etch step in which any exposed dielectric blocking material 216 is selectively etched from within the via opening 226. The selective etch may include chemical or energetic etch that targets the dielectric blocking material 216 without etching or effecting the lower dielectric layer 204, or any other component aside from the dielectric blocking materials 216. The second dielectric blocking material 216b, for example, is completely etched from above the second conductive line 206b, leaving a self-aligned via cavity 234 within a second lower level via region 214b. Additionally (and unintentionally), the misalignment overlap 232 of the via opening 226 causes the portion of the first dielectric blocking material 216a under the overlap 232 to also be etched from above the first conductive line 206a, leaving a spacer region 236 within the first lower level via region 214a.

Figure 11:
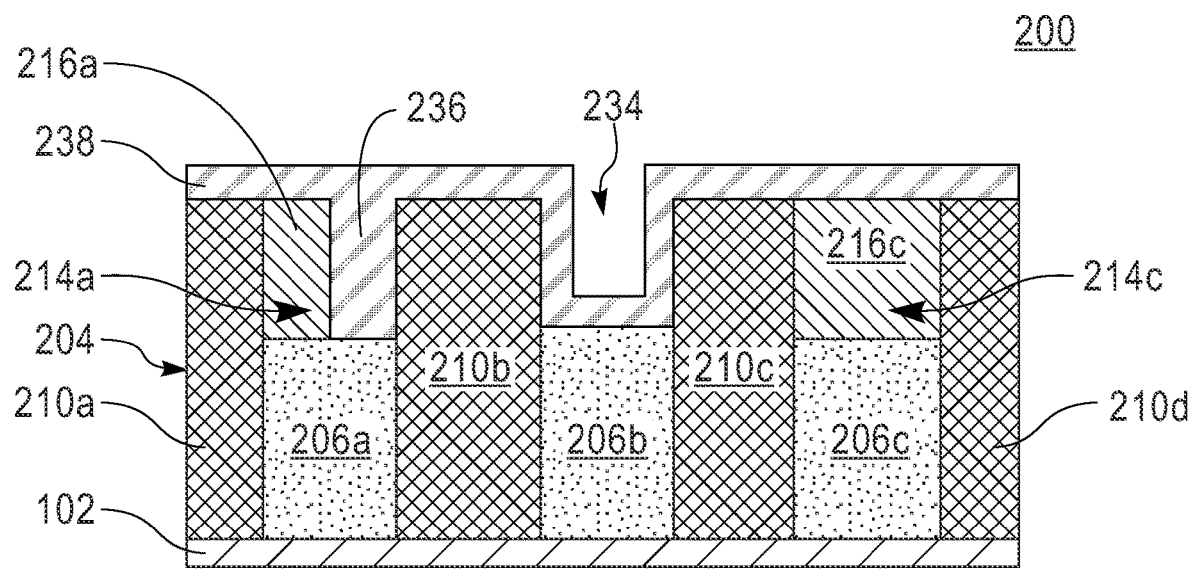
FIG. 11 is a schematic cross-sectional side view of the semiconductor structure of FIG. 9 at a fabrication state, in accordance with one embodiment of the present invention.

FIG. 11 is a schematic cross-sectional side view depicting the semiconductor structure 200 at a fabrication stage of the processing method, in accordance with one embodiment of the present invention. FIG. 11 shows a spacer material 238 formed over the semiconductor structure 200 after the mask 224 has been removed. The spacer material 238 forms over just the lower dielectric layer 204, and within the self-aligned via cavity 234 and the spacer region 236 since the semiconductor structure 200 does not have any upper dielectric layer. The spacer region 236, in this embodiment, is also narrow enough that the spacer material 238 pinches off. The spacer material 238 does not pinch off in the self-aligned via cavity 234.

Figure 12:
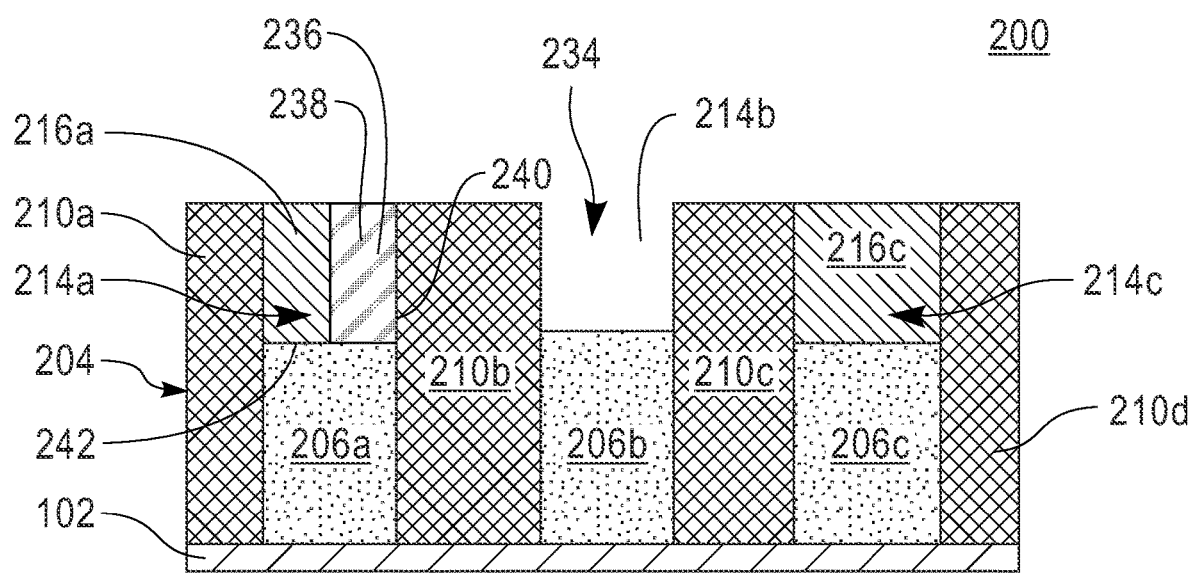
FIG. 12 is a schematic cross-sectional side view of the semiconductor structure of FIG. 9 at a fabrication state, in accordance with one embodiment of the present invention.

FIG. 12 is a schematic cross-sectional side view depicting the semiconductor structure 200 at a fabrication stage of the processing method, in accordance with one embodiment of the present invention. FIG. 12 shows the spacer material 238 etched from the lower dielectric layer 204 and within the self-aligned via cavity 234. The spacer material 238 may be etched using a lateral etching process. The spacer material 238 is not etched, however, from within the spacer region 236 due to the pinch off between a first side 240 and a second side 242. Therefore, the first lower level via region 214a is fully blocked, the third lower level via region 214c is fully blocked (i.e., having an intact dielectric blocking material 216c) while the second lower level via region 214b is open.

Figure 13:
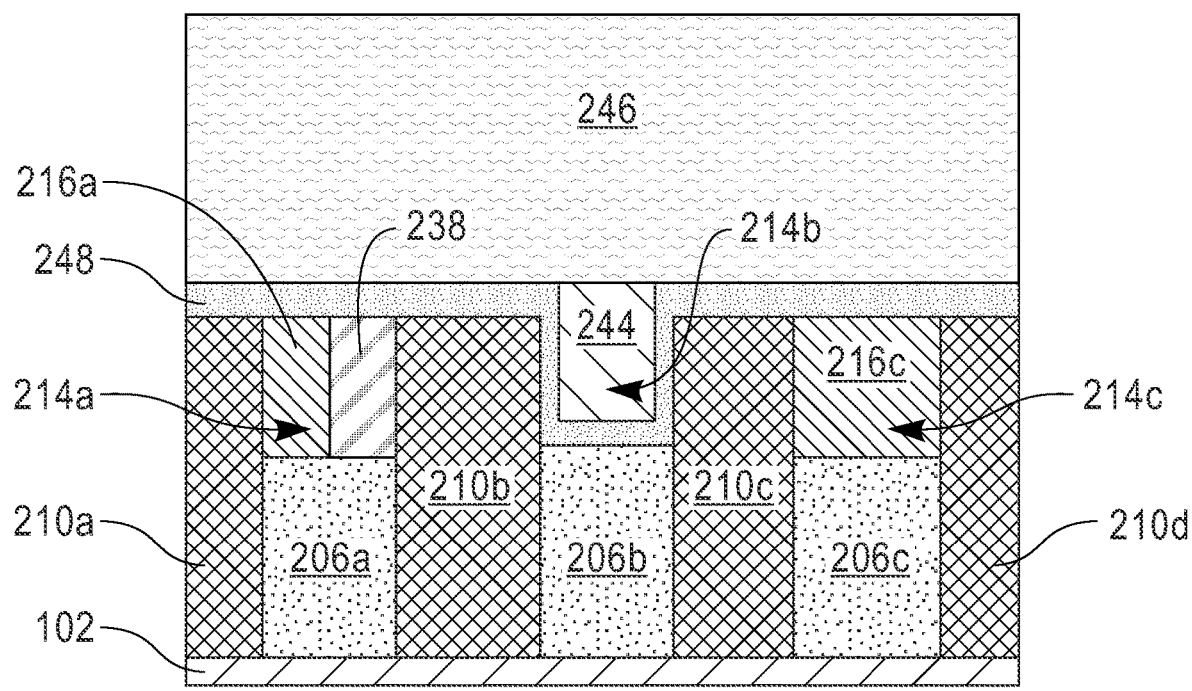
FIG. 13 is a schematic cross-sectional side view of the semiconductor structure of FIG. 9 at a fabrication state, in accordance with one embodiment of the present invention.

FIG. 13 is a schematic cross-sectional side view depicting the semiconductor structure 200 at a fabrication stage of the processing method, in accordance with one embodiment of the present invention. FIG. 13 shows a conductive via 244 formed in the second lower level via region 214b and an upper conductive line 246 formed above the lower dielectric layer 204.

Figure 14:
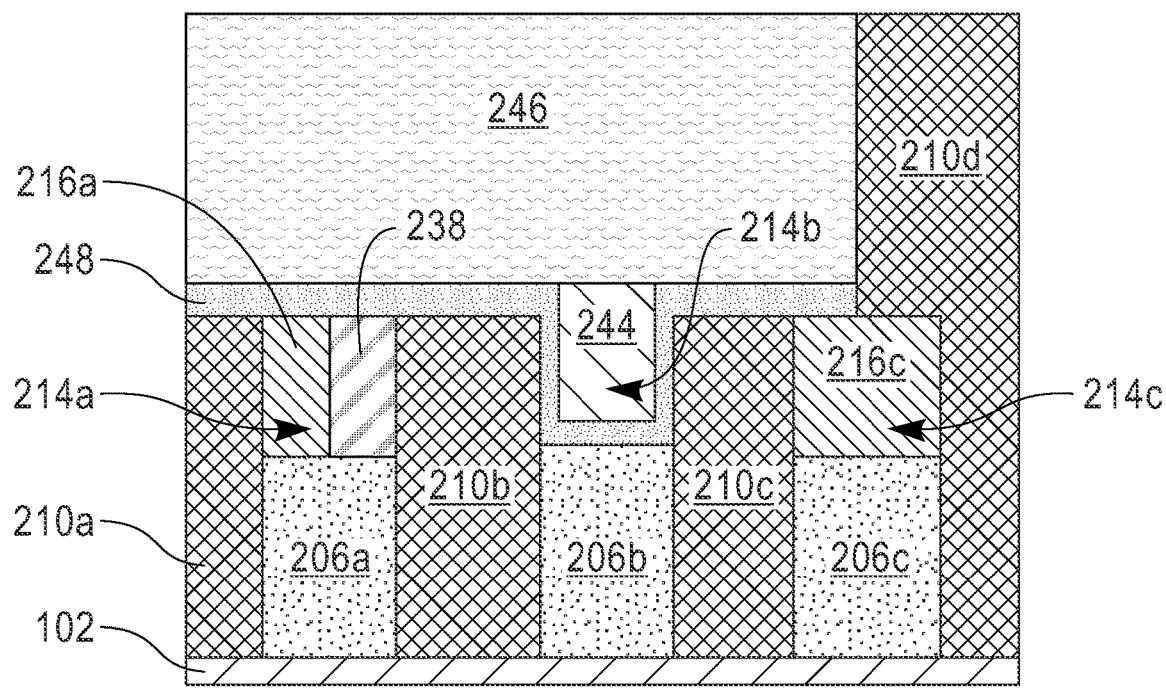
FIG. 14 is a schematic cross-sectional side view of the semiconductor structure of FIG. 9 at a fabrication state, in accordance with one embodiment of the present invention.

FIG. 14 is a schematic cross-sectional side view depicting the semiconductor structure 200 at a fabrication stage of the processing method, in accordance with one embodiment of the present invention. FIG. 14 shows the upper dielectric layer 220 formed outside of a line region 222. The semiconductor structure 200 also includes a etch stop layer 248 below the conductive via 244. The conductive via 244 may be formed of a same or similar material as the lower conductive lines 206 and the upper conductive line 246. The spacer material 238 prevents any electrical signal or energy from propagating between the first lower conductive line 206a and the upper conductive line 246 through the spacer region 236. Without the spacer material 238, the process of forming the conductive via 144 could potentially form conductive material within the spacer region 136, but the spacer material 138 has blocked that possibility.

The integrated circuit chips resulting from the processes described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a first lower conductive line laterally insulated by a first lower dielectric region and a second lower dielectric region;
a lower level via region above the first lower conductive line, comprising:
 a dielectric blocking material contacting the first lower dielectric region; and
 a spacer material laterally between and contacting both: i) the second lower dielectric region and ii) the dielectric blocking material; and
an upper conductive line directly contacting top surfaces of the dielectric blocking material, the spacer material, and the first lower dielectric region.

2. The semiconductor structure of claim 1, further comprising:
a second lower conductive line insulated laterally by the second lower dielectric region and a third dielectric region; and
a conductive via electrically coupled to the second lower conductive line and to the upper conductive line.

3. The semiconductor structure of claim 2, wherein the upper conductive line laterally overlaps the conductive via, the second lower dielectric region and the spacer material.

4. The semiconductor structure of claim 2, comprising:
a third lower conductive line insulated laterally by the third dielectric region and a fourth dielectric region; and
a dielectric blocking material located vertically between the third lower conductive line and an upper dielectric layer.

5. The semiconductor structure of claim 1, wherein the dielectric blocking material comprises a first material and the spacer material comprises a second material.

6. The semiconductor structure of claim 1, comprising an upper dielectric layer.

7. The semiconductor structure of claim 6, comprising a metal etch stop layer between the dielectric blocking material and the upper dielectric layer.

8. A semiconductor structure, comprising:
a first lower level via region over a first lower level conductive line laterally insulated by a first lower dielectric region and a second lower dielectric region, comprising:
 a spacer region comprising a spacer material contacting the second lower dielectric region; and
 a first dielectric blocking material laterally between and contacting both i) the first lower dielectric region and ii) the spacer region; and
a second lower level via region over a second lower level conductive line comprising a conductive via electrically coupling the second lower level conductive line to an upper conductive line, wherein the upper conductive line directly contacts top surfaces of the first dielectric blocking material, the spacer material, and the first lower dielectric region.

9. The semiconductor structure of claim 8, wherein the first lower level via region is insulated from the second lower level via region by the second lower dielectric region, and the second lower level via region is insulated from a third lower level via region by a different dielectric region.

10. The semiconductor structure of claim 8, wherein the spacer region insulates the first lower level conductive line from the upper conductive line.

11. The semiconductor structure of claim 8, wherein the conductive via comprises a metal that is different from a metal of the second conductive line and from a metal of the upper conductive line.

12. The semiconductor structure of claim 8, wherein the conductive via comprises a metal that is the same as a metal of the second conductive line and a metal of the upper conductive line.

13. The semiconductor structure of claim 8, comprising a third lower level via region over a third lower level conductive line comprising a third dielectric blocking material, wherein the first dielectric blocking material comprises a material that is the same as the third dielectric blocking material.

* * * * *